United States Patent
Babcock et al.

(10) Patent No.: US 6,658,736 B1
(45) Date of Patent: Dec. 9, 2003

(54) METHOD OF FABRICATING A HEAT EXCHANGER, FOR REGULATING THE TEMPERATURE OF MULTIPLE INTEGRATED CIRCUIT MODULES, HAVING A FACE OF A SOLID MALLEABLE METAL COATED WITH A RELEASE AGENT

(75) Inventors: James Wittman Babcock, Escondido, CA (US); Jerry Ihor Tustaniwskyj, Mission Viejo, CA (US); Blanquita Ortega Morange, Poway, CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/215,992

(22) Filed: Aug. 9, 2002

(51) Int. Cl.$^7$ ................................................ B23P 15/26
(52) U.S. Cl. ..................... 29/890.03; 29/458; 165/80.3; 165/185
(58) Field of Search ............................. 29/890.03, 458, 29/840, 837, 843, 593; 165/80.3, 185; 361/710, 709, 699; 324/760

(56) References Cited

U.S. PATENT DOCUMENTS

| | | | | | |
|---|---|---|---|---|---|
| 5,056,706 | A | * | 10/1991 | Dolbear et al. | 228/180.21 |
| 5,323,294 | A | * | 6/1994 | Layton et al. | 361/699 |
| 5,912,802 | A | * | 6/1999 | Nelson | 361/695 |
| 6,116,331 | A | * | 9/2000 | Tustaniwskyj et al. | 165/80.4 |
| 6,179,047 | B1 | * | 1/2001 | Tustaniwskyj et al. | 165/80.4 |
| 6,196,299 | B1 | * | 3/2001 | Tustaniwskyj et al. | 165/80.3 |
| 6,243,944 | B1 | * | 6/2001 | Tustaniwskyj et al. | 29/840 |
| 6,307,388 | B1 | * | 10/2001 | Friedrich et al. | 324/754 |
| 6,362,944 | B1 | * | 3/2002 | Tustaniwskyj et al. | 361/103 |
| 6,412,551 | B1 | * | 7/2002 | Tustaniwskyj et al. | 165/264 |

* cited by examiner

Primary Examiner—Irene Cuda-Rosenbaum
(74) Attorney, Agent, or Firm—Charles J. Fassbender; Mark T. Starr; Lisa A. Rode (57) ABSTRACT

A heat exchanger, for regulating the temperature of multiple integrated circuit modules, is fabricated by constructing a face on a hollow jacket such that the face consists essentially of a malleable metal with a coating of a release agent. In one embodiment, the malleable metal is fabricated as a foil which is attached to the jacket by an adhesive, and the coating is fabricated as a powder of the release agent which is rubbed into the surface of the foil.

17 Claims, 8 Drawing Sheets

MOD #1      APPLY RELEASE AGENT 25 BY:

1)    SPUTTER ONTO SURFACE OF METAL 23;

2)    SPRAY ONTO SURFACE OF METAL 23;

3)    BRUSH INTO SURFACE OF METAL 23;

4)    MELT INTO SURFACE OF METAL 23.

MOD #2      SELECT RELEASE AGENT 25 FROM:

1) ALUMINUM                    2) BORON NITRIDE          3) SILVER OXIDE               4) SILVER          5) BISMUTH OXIDE            6) INDIUM OXIDE          7) ALUMINUM OXIDE          8) MAGNESIUM OXIDE          9) MOLYBDENUM OXIDE

MOD #3      APPLY METAL 23 BY:

1)    SOLDER FOIL ONTO COVER 22;

2)    SPUTTER METAL ONTO COVER 22;

3)    PLATE METAL ONTO COVER 22;

4)    MELT METAL ONTO COVER 22;

5)    EVAPORATE METAL ONTO COVER 22.

MOD #4      SELECT METAL 23 FROM:

1)    SILVER, OR GOLD;

2)    INDIUM BASED ALLOY WITH CADMIUM, LEAD, TIN, BISMUTH, SILVER, OR ZINC;

3)    BISMUTH BASED ALLOY WITH CADMIUM, LEAD, TIN, ZINC, OR SILVER;

4)    SILVER BASED ALLOY WITH INDIUM, COPPER, BISMUTH, LEAD, OR TIN;

5)    LEAD BASED ALLOY WITH TIN.

FIG. 6

MOD #5    ITEM 12c CAN BE:

1) INTEGRATED CIRCUIT CHIP BY ITSELF;

2) CHIP WITH I/O TERMINALS ATTACHED TO SUBSTRATE;

3) CHIP COMPLETELY INSIDE OF I.C. PACKAGE;

4) CHIP ATTACHED TO LID OF I.C. PACKAGE.

CONTACT SURFACE S1 CAN BE:

1) SILICON DIOXIDE;    2) ALUMINUM LID;

3) NICKEL LID;    4) COPPER LID.

"INTEGRATED CIRCUIT MODULE" MEANS ALL OF ABOVE

MOD #6    SQUEEZING FORCE = 4.0 LBS. TO 20.0 LBS.

MOD #7    REPLACE METAL 23 AFTER:

1) 500 "OPEN" AND "CLOSE" CYCLES;

2) 1000 "OPEN" AND "CLOSE" CYCLES;

3) 3000 "OPEN" AND "CLOSE" CYCLES;

4) >3000 "OPEN" AND "CLOSE" CYCLES.

MOD #8    REPLACE FOIL OF METAL 23 BY:

- USE PHASE CHANGE ADHESIVE 24,

- HEAT ADHESIVE TO LIQUID STATE.

MOD #9    NON-STICKING FOIL OF METAL 23, WITH PHASE CHANGE ADHESIVE 24, BUT NO RELEASE AGENT 25.

METHOD OF FABRICATING A HEAT EXCHANGER, FOR REGULATING THE TEMPERATURE OF MULTIPLE INTEGRATED CIRCUIT MODULES, HAVING A FACE OF A SOLID MALLEABLE METAL COATED WITH A RELEASE AGENT

CROSS-REFERENCES TO RELATED APPLICATION

This application shares a common Detailed Description with a co-pending application entitled "METHOD AND APPARATUS FOR REGULATING THE TEMPERATURE OF INTEGRATED CIRCUIT MODULES, USING A HEAT EXCHANGER WITH A FACE OF A SOLID MALLEABLE METAL AND A RELEASE AGENT", Ser. No. 10/215,993, which was filed concurrently with the present application.

BACKGROUND OF THE INVENTION

This invention relates to methods and apparatus which regulate the temperature of multiple integrated circuit modules by conducting heat thru a pressed joint with each module, one module at a time.

In the prior art, many electromechanical assemblies have been disclosed in which heat flows between an integrated circuit chip and a temperature regulating unit along a thermal conduction path which includes one or more joints. In the case where the components of a joint are rigidly fused together (such as by a solder), then the task of taking the joint apart in order to replace a chip is made difficult. Consequently, fused joints with chips are not suitable in assemblies where the chips are frequently replaced, such as assemblies that test hundreds of chips sequentially.

On the other hand, in the case where a joint consists of two components that are merely pressed together, then the thermal resistance through the joint is increased. This higher resistance occurs because the surfaces of the two components that are pressed together are never perfectly flat, and thus microscopic air gaps exist between the surfaces.

To reduce the thermal resistance through a pressed joint, thermal greases and metal pastes have been developed. When a layer of these materials is placed in the joint between two components that are pressed together, then the microscopic air gaps between the components are reduced which in turn reduces thermal resistance through the joint. Examples of such thermal greases and metal pastes are described in U.S. Pat. No. 5,056,706 which is entitled "Liquid Metal Paste for Thermal and Electrical Connections".

However, one drawback of a thermal grease is that its thermal conductivity is still relatively low, in comparison to the conductivity of a metal. See the above U.S. Pat. No. 5,056,706 at column 2, lines 24–29.

Also, another problem with both the thermal grease and the metal paste is that they stick to the two components which are pressed together. If the grease or paste is squeezed between a heat exchanger and a chip that is held in a socket, the sticking force can cause the chip to be pulled-out of the socket when an attempt is made to separate the heat exchanger from the chip.

Further, as the chip is separated from the heat exchanger, a residue portion of the grease or paste remains on the separated components. If the heat exchanger is part of an electromechanical assembly which tests hundreds of integrated circuit chips, then any grease or paste which is retained by a chip must be cleaned off of the chip before the chip can be put into an end product. However, the task of cleaning the residue grease or paste from each chip before the chip is put into an end product adds to the time and cost of producing the end product.

Also in the prior art, another pressed joint is disclosed in U.S. Pat. No. 5,323,294 by W. Layton, et al. entitled "Liquid Metal Heat Conducting Member and Integrated Circuit Package Incorporating Same." In this patent, two components are pressed together with a thin compliant body lying between them which has microscopic voids (like a sponge), and a liquid metal alloy is absorbed by the compliant body and partially fills the voids.

However, a drawback of this joint is that it requires the compliant body as a carrier for the liquid metal, and this compliant body is an extra component which adds to the cost of the joint. Also, when the joint is taken apart, a portion of the liquid metal can be squeezed out of the compliant body and adhere to the two components that were pressed together; and that is a residue which must be cleaned up.

In addition in the prior art, still another pressed joint is disclosed in U.S. Pat. No. 6,243,944 by J. Tustaniwskyj et al which is entitled "Residue-Free Method of Assembling And Disassembling A Pressed Joint With Low Thermal Resistance". This pressed joint can be between a heat exchanger and an integrated circuit package which contains a chip, where the package has a lid that is made of a first material; the heat exchanger has a face that is made of a second material; and a special type of metal alloy is squeezed between the lid on the package and the face of the heat exchanger.

In particular, the above alloy is limited to one that: a) is in a liquid state at a certain temperature at which the chip is initially contacted, and b) adheres in a solid state, at a lower temperature, to the second material (the heat exchanger) but does not adhere to the first material (the integrated circuit package). Since the alloy is liquid when the chip is tested, microscopic air gaps between the lid of the package and the heat exchanger are reduced. Then when the test is complete, the alloy is solidified at the lower temperature so that the package and the heat exchanger can be separated with all of the alloy adhering to the heat exchanger.

However, the present inventors have discovered that a drawback with the above pressed joint is that if the lid of the package is larger than the face of the heat exchanger, then any excess alloy tends to get squeezed off of the heat exchanger and onto the lid when those two components are pressed together while the alloy is in a liquid state. Further, the present inventors have discovered that the remaining alloy which stays on the heat exchanger tends to oxidize while the alloy is in the liquid state. This oxidizing limits the number of chips which can be tested using a single heat exchanger, because as the alloy oxidizes, its thermal resistance increases. By making the face of the heat exchanger larger than the lid of the package, the excess alloy stays on the heat exchanger, and so a larger amount of alloy needs to oxidize before the effect on thermal resistance becomes significant. However, even the larger amount of alloy still tends to oxidize when in a liquid state because it gets "stirred up" as it is pressed against the lid of the package; and this eventually limits the number of chips which can be tested with a single heat exchanger.

Accordingly, a primary object of the present invention is to overcome all of the above-described drawbacks with the pressed joints of the prior art.

BRIEF SUMMARY OF THE INVENTION

The present invention covers a method of fabricating a heat exchanger for use in testing multiple integrated circuit modules at a predetermined temperature, where each module has an uneven contact surface. One embodiment of this method includes the steps of: a) providing a hollow jacket which has an input port and an output port for passing a fluid thru the jacket; and b) constructing a face, on an external portion of the jacket, which consists essentially of a malleable metal that remains in a solid state at the predetermined temperature and has a coating of a release agent that prevents sticking to each contact surface.

As a particular example of the above step of constructing the face, the malleable metal is disposed on the hollow jacket in the form of a foil; and, the foil is attached to the hollow jacket by an adhesive. Also as a further example, the coating of the release agent is constructed by applying the release agent in a powder form on the malleable metal, and rubbing the powder into the surface of the malleable metal.

One function which the malleable metal performs is that when it is pressed by just a small force against the contact surface, the malleable metal deforms; and that reduces microscopic air gaps between the malleable metal and the contact surface. This in turn lowers the thermal resistance between the malleable metal and the contact surface. At the same time, the release agent prevents the malleable metal from sticking to the contact surface; and so the malleable metal can be easily separated from the contact surface.

Another function which the malleable metal performs is that it remains solid when it is pressed against the contact surface; and thus the malleable metal cannot move like a liquid, from the face of the heat exchanger to the contact surface when those two components are squeezed together. Also, the malleable metal is much more resistant to being oxidized in the solid state than it would be in a liquid state; and consequently, the thermal resistance of the malleable metal stays essentially constant while it is squeezed against and separated from the contact surface of many integrated circuit modules.

DETAILED DESCRIPTION

One preferred embodiment of the present invention will be now described with reference to FIGS. 1A, 1B, 1C and 2, 3, 4A and 4B. This particular embodiment is an electromechanical assembly 10 for testing integrated circuit chips which are held in sockets on printed circuit boards.

Figure 3:
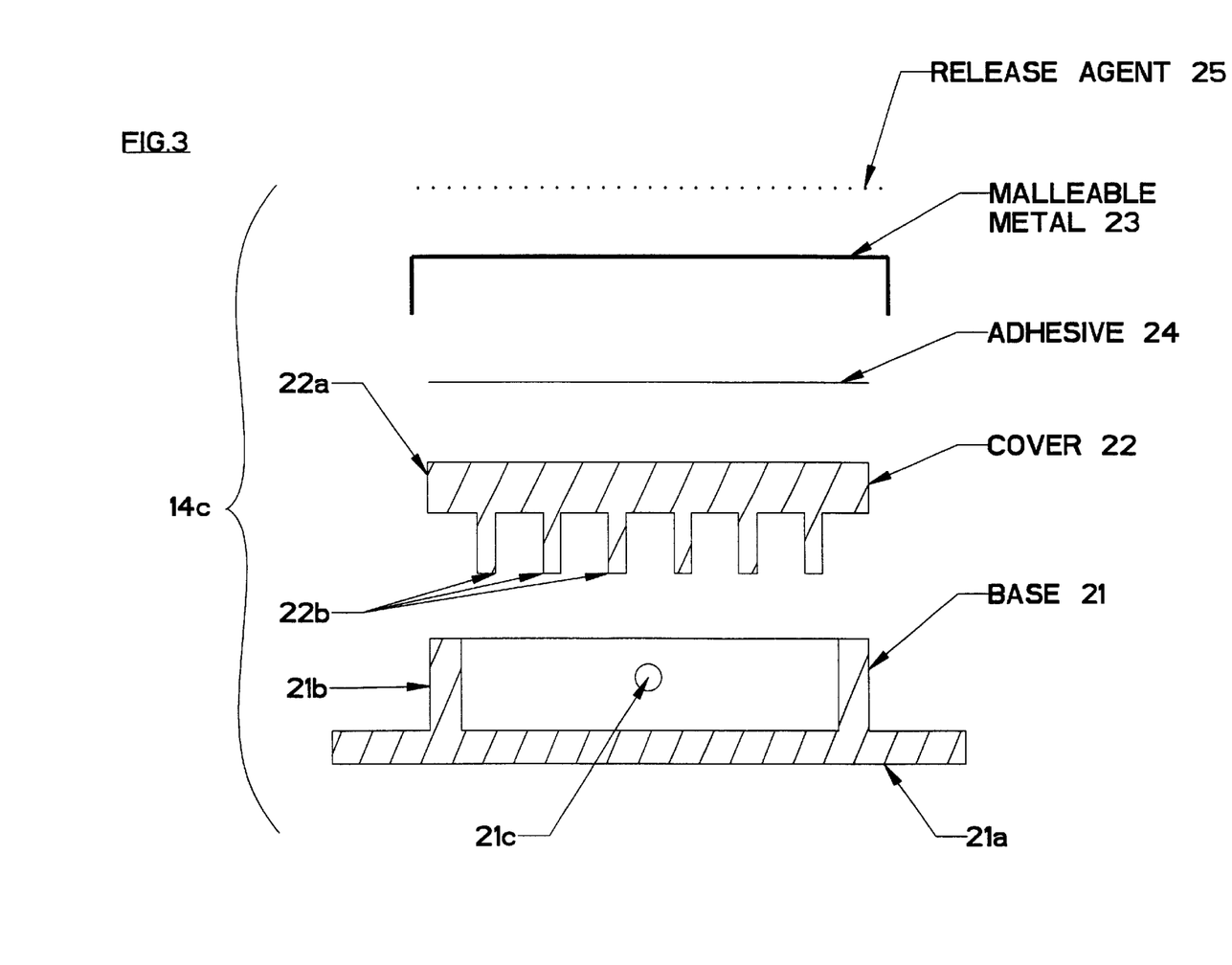
FIG. 3 shows a novel structure for a heat exchanger which is a key component in one of the subassemblies of FIG. 1C.
Figure 4A:
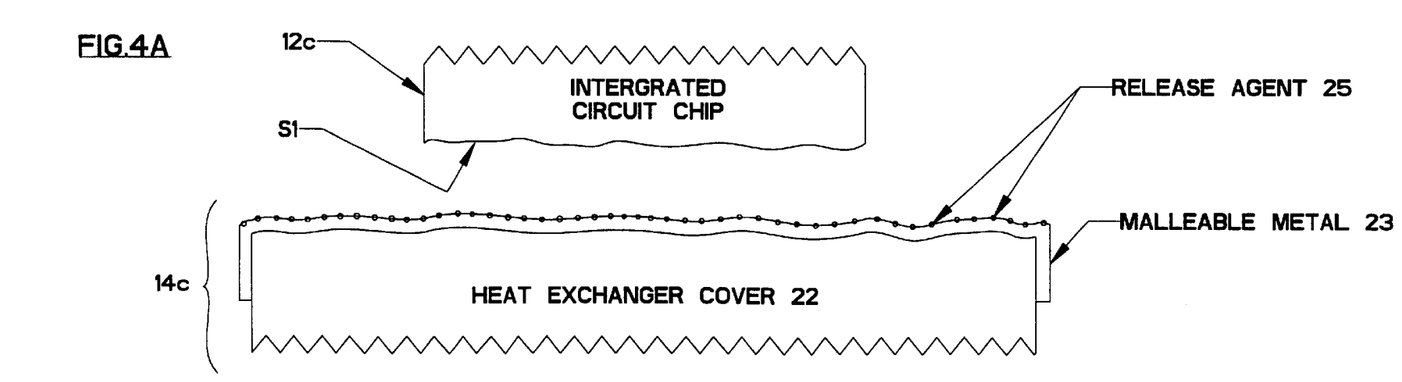
FIG. 4A shows the face on the heat exchanger of FIG. 3, while the face is held spaced-apart from an integrated circuit chip by the electromechanical assembly of FIGS. 1A and 1B.
Figure 4B:
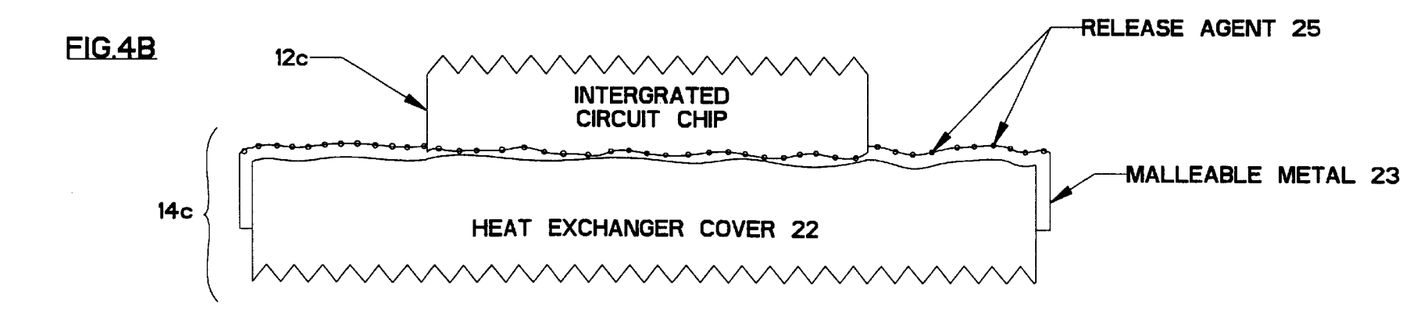
FIG. 4B shows the face on the heat exchanger of FIG. 3, while the face is squeezed against the integrated circuit chip by the electromechanical assembly of FIGS. 1A and 1B.

The assembly 10 is comprised of six different types of subassemblies 11–16 which are illustrated in FIGS. 1A, 1B, 1C and 2. Additional details of the subassembly 14, which is a key novel part of the present invention, are shown in FIGS. 3, 4A and 4B.

Each subassembly 11–16 includes several components, and all of the components of any one particular subassembly are identified by the same reference numeral with a different letter appended to it. For example, components 11a–11g are in subassembly 11. Each subassembly 11–16, and their respective components, will now be described.

Subassembly 11 is a frame that includes components 11a–11g. Component 11a is a horizontal base of the frame which has several legs 11b that are rigidly connected to the base 11a. Components 11c–11f are four vertical columns which are rigidly connected to the base 11a; and component 11g is a top of the frame which is rigidly connected to the columns 11c–11f.

Subassembly 12 is a chip holding subassembly which includes components 12a–12d. From one to fourteen of these chip holding subassemblies 12 are held by the frame 11. Component 12a is a printed circuit board which has one face 12a-1 and an opposite face 12a-2. Face 12a-1 is seen only in FIG. 2, and attached to it are N sockets 12b, each of which holds one IC chip 12c that is to be tested. Here, N is any desired number, such as sixteen or thirty for example. Attached to face 12b-1 are N sets of electrical contacts 12d, and each set carries all of the electrical power and all signals for one of the chips 12c. Each socket 12b is connected to one set of contacts 12d by microscopic conductors (not shown) that pass thru the printed circuit board 12a.

Subassembly 13 is a power converter subassembly which includes components 13a–13c. A separate power converter subassembly 13 is held by the frame 11 above each chip holding subassembly 12. Component 13a is a printed circuit board which has one face 13a-1 and an opposite face 13a-2. Face 13a-1 is seen only in FIG. 2, and attached to it are N sets of electrical contacts 13b, each of which mates with one set of the contacts 12d on the chip holding subassembly 12. Attached to face 13a-2 are N DC-DC power converters 13c. Each power converter 13c supplies power to one set of the contacts 13b, and it is connected to those contacts by microscopic conductors (not shown) that pass through the printed circuit board 13a.

Subassembly 14 is a temperature regulating subassembly which includes components 14a–14d. A separate temperature regulating subassembly 14 is held by the frame 11 below each chip holding assembly 12. Component 14a is a flat rigid plate which has one face 14a-1 and an opposite face 14a-2. Attached to face 14a-2 are N springy components 14b, and each springy component 14b holds one heat exchanger 14c such that it is aligned with one chip 12c in the chip holding assembly 12.

Each heat exchanger 14c has a particular structure which will be described in detail later in conjunction with FIGS. 3, 4A and 4B. Briefly however, each heat exchanger 14c has a novel face that is specially adapted to be pressed against the one chip 12c to which the heat exchanger is aligned. Due to that novel face: 1) a low thermal resistance occurs between the heat exchanger 14c and the chip 12c; 2) the heat exchanger 14c does not stick to the chip; and 3) the face of the heat exchanger 14c is resistant to oxidation.

Several stops 14d are attached to face 14a-2 of the rigid plate 14a, and these stops are aligned with the spaces between the sockets 12b in the chip holding assembly 12. These stops 14d limit the force with which the heat exchanger 14c can be pressed against the chips 12c. This is achieved by limiting the amount by which the springy components 14b get compressed when the subassemblies 12–14 are squeezed together. Preferably, the stops 14d have a length which is selectable within a predetermined range so that the heat exchangers 14c are pressed against the chips 12c with a force that can be adjusted up or down.

Subassembly 15 is a pressing mechanism which presses the subassemblies 12, 13 and 14 together. In order to press those subassemblies 12–14 together, the power converter subassembly 13 is held stationary in the frame 11, and the pressing mechanism 15 moves the temperature regulating subassembly 14 upward. This upward movement causes the chip holding subassembly 12 to be squeezed between the temperature regulating subassembly 14 and the power converter subassembly 13.

For each chip holding subassembly 12 that is held in the frame 11, two copies of the pressing mechanism 15 are provided. One copy is held in the frame by columns 11c and 11d, while the other copy is held in the frame by columns 11e and 11f.

Subassembly 16 is an actuator for all of the pressing mechanisms 15 which are in the frame 11, and it includes components 16a–16f. Component 16a is a plate which moves up and down in the frame between columns 11c and 11d. Component 16b is identical to plate 16a, and it moves up and down in the frame between columns 11e and 11f. Plate 16a has a separate pair of slots 16a-1 for each pressing mechanism 15 that is held by the frame columns 11c and 11d, and plate 16b has a separate pair of slots 16b-1 for each pressing mechanism 15 that is held by the frame columns 11c and 11f.

As the plates 16a and 16b move, the slots 16a-1 and 16b-1 act as tracks which cause all of the pressing mechanisms 15 to move. When the plates 16a and 16b move down, the pressing mechanisms 15 move to an open position where the subassemblies 12, 13 and 14 are spaced-apart. Conversely, when the plates 16a and 16b move up, the pressing mechanisms 15 move to a closed position where the subassemblies 12, 13 and 14 are pressed together.

Component 16c is an electric motor. Component 16d is a linkage between the motor 16c and plate 16a; and component 16e is a linkage between the motor 16c and plate 16b. These components 16c–16e move the plates 16a and 16b up, and move the plates down, in response to control signals that are sent on conductors 16f to the motor 16c from manually operated control switches (not shown).

Figure 2:
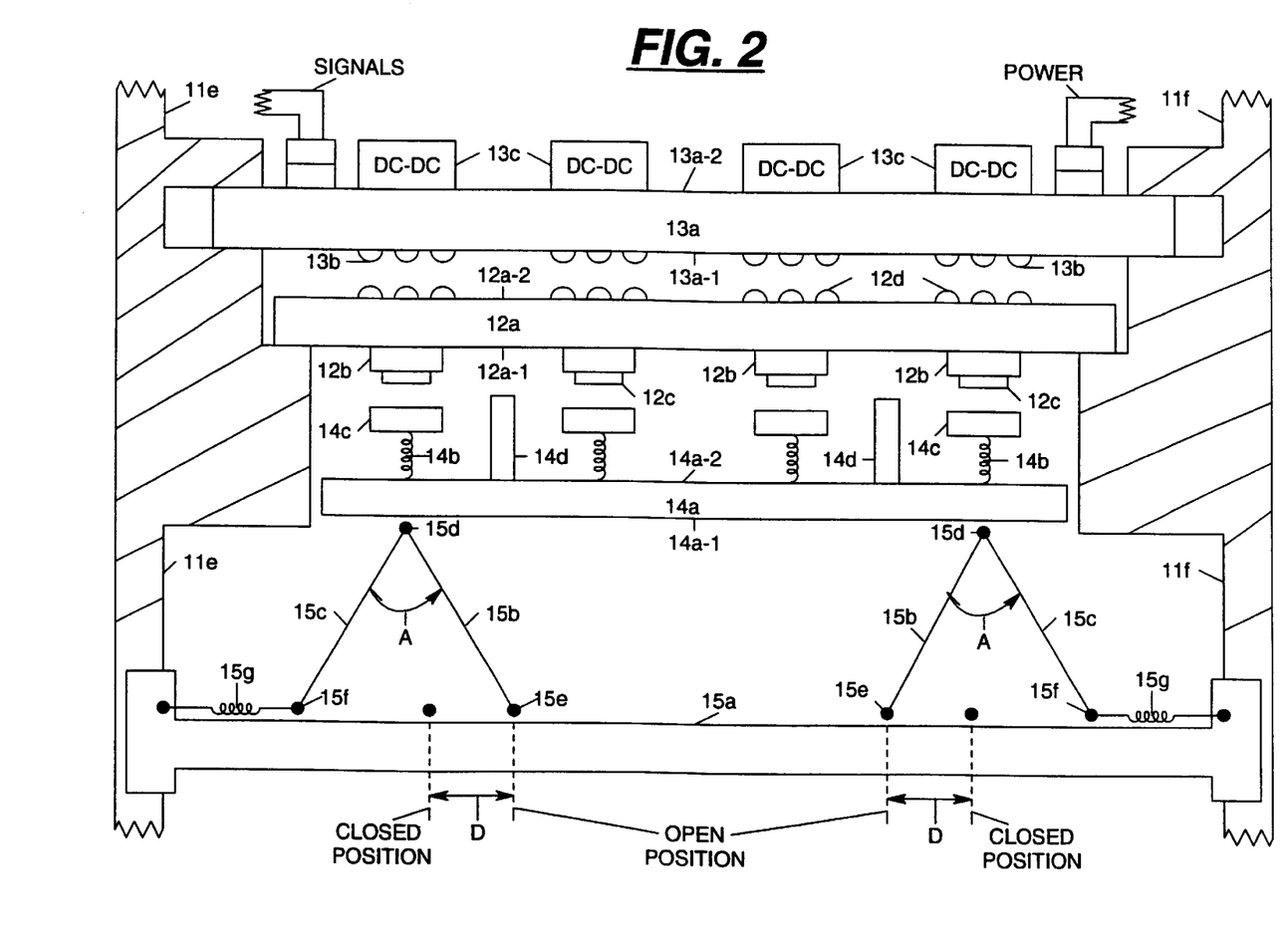
FIG. 2 is a schematic diagram of the electromechanical assembly of FIGS. 1A and 1B which shows how the three subassemblies of FIG. 1C are squeezed together.

How the chip holding subassembly 12, the power converter subassembly 13, the temperature regulating subassembly 14, and the pressing mechanism 15 are held relative to each other by the frame 11 is shown schematically in FIG. 2. In addition, FIG. 2 schematically illustrates how the pressing mechanism 15 squeezes the chip holding subassembly 12 between the power converter subassembly 13 and the temperature regulating subassembly 14.

Included within the pressing mechanism 15 of FIG. 2 are components 15a–15g. Component 15a is a rail which is rigidly attached to the frame columns 11e and 11f. This rail 15a lies below the temperature regulating subassembly 14 and is parallel to face 14a-1 of the plate 14a. Components 15b and 15c are a pair of arms that are coupled together with a pivotal joint 15d which presses against face 14a-1 of the plate 14a. These arms 15b and 15c also have slidable joints 15e and 15f which slide on the rail 15a. Component 15g is a spring which is coupled between the slidable joint 15f and the frame 11. All of the components 15b–15g are duplicated in the pressing mechanism 15 as shown in FIG. 2.

Both of the slidable joints 15e fit into one pair of the slots 16b-1 in the plate 16b. The slots 16b-1 of each pair are close together at their top and far apart at their bottom. Thus, as the plate 16b move down, the joints 15e slide close together to an "open" position. There, the angle "A" between each pair of arms 15b and 15c is large; and so the pivotal joints 15d have moved down. Consequently, the three subassemblies 12, 13, and 14 are spaced apart from each other.

Conversely, as the plate 16d moves up, the joints 15e slide far apart to a "closed" position. There, the angle "A" between each pair of arms is small; and so the pivotal joints 15d have moved up. Consequently, the three subassemblies 12, 13, and 14 are squeezed together.

When the three subassemblies 12, 13 and 14 are squeezed together, each heat exchanger 14c presses against the one chip 12c that is aligned to the heat exchanger. Consequently, heat passes by conduction between each heat exchanger and the chip which the heat exchanger contacts. And, while that is occurring, all of the chips 12c are tested by signals which are sent to the chips, and received from the chips, thru the electrical contacts 12d and 13b.

Next, with reference to FIG. 3, one preferred structure for each heat exchanger 14c will be described in detail. In this particular structure, the heat exchanger 14c is comprised of components 21–25.

Component 21 is the base of the heat exchanger 14c. The base 21 has a flat bottom 21a and a cylindrical sidewall 21b that extends around the perimeter of the flat bottom. The cylindrical sidewall 21b has an input port 21c, and an output port (not shown) which is directly across from the input port.

Component 22 is a cover for the base 21. The cover 22 has a flat top 22a and a set of fins 22b that extend toward the flat bottom. The flat top 22a is permanently attached to the cylindrical sidewall 21b. The cover 22 together with the base 21 constitute a jacket for holding a liquid that flows from the input port 21c to the output port.

Component 23 is a foil of a malleable metal which stays in a solid state while the chips 12c are tested. In one particular preferred embodiment, this malleable metal 23 is indium. One function which this malleable metal 23 performs is that when it is pressed by just a small force against a chip 12c by the electromechanical assembly of FIG. 2, the malleable metal 23 deforms and thereby reduces microscopic air gaps between itself and the chip. This in turn lowers the thermal resistance between the malleable metal 23 and the chip 12c.

Also, since the malleable metal 23 remains solid throughout chip testing process, the malleable metal 23 does not get "stirred-up" like a liquid when the chip 12c and the malleable metal 23 are initially squeezed together. Thus the malleable metal 23 is much more resistant to oxidizing than it would be in a liquid state, and that keeps the thermal resistance of the malleable metal at a low level while the electromechanical assembly of FIG. 2 cycles many times between the "open" and the "closed" positions.

Component 24 is a thermal adhesive which holds the foil of solid malleable metal 23 on the cover 22. An example of one suitable adhesive is a silicone that is loaded with a thermally conductive powder.

Component 25 is a release agent which prevents the solid malleable metal 23 from sticking to the chip 12c when those two components are squeezed together by the electromechanical assembly of FIG. 2. In one particular preferred embodiment, this release agent 25 is aluminum nitride in a powder form.

The aluminum nitride particles form a coating on the solid malleable metal 23. One preferred method for constructing this coating is to: a) mix the aluminum nitride particles with a liquid (such as alcohol), b) wet a cloth with above mixture, and c) rub the surface of the solid malleable metal 23 with the wet cloth. By this rubbing, the aluminum nitride particles get transferred from the cloth and embedded into the surface of the solid malleable metal 23. By wetting the cloth with the mixture, the aluminum nitride particles do not get scattered all over the workplace floor.

The solid malleable metal 23 with the coating of the release agent 25 together constitute a novel face, on the heat exchanger 14c, for contacting a chip 12c while the chip is tested. How this face operates, at a microscopic level, is illustrated in FIGS. 4A and 4B.

When the electromechanical assembly of FIG. 2 is in the "open" position, the face of the heat exchanger 14c is spaced-apart from the chip 12c as shown in FIG. 4A. By comparison, when the electromechanical assembly of FIG. 2 is in the "closed" position, the face of the heat exchanger 14c is squeezed against the chip 12c as shown in FIG. 4B.

Inspection of FIG. 4A shows that the chip 12c has a contact surface S1 which, at a microscopic level, is uneven. Further, this uneven surface is different for each chip 12c that needs to be tested. Consequently, in the "open" position of FIG. 4A, the contact surface S1 differs in shape from the face of the heat exchanger 14c.

However, as the chip 12c and the heat exchanger 14c are squeezed together, the malleable metal 23 deforms and thereby conforms to the shape of the chip contact surface S1. This is seen from FIG. 4B. Consequently, a low thermal resistance is obtained between the chip 12c and the heat exchanger 14c. The chip 12c and the heat exchanger 14c remain squeezed together, as shown in FIG. 4B, while the testing of the chip 12c occurs.

While the chip 12c is tested, a liquid (such as water) having a temperature TL is forced thru the heat exchanger 14c from the input port 21c to the output port. This maintains the chip 12c at a temperature TC, where TC minus TL equals the power dissipated by the chip 12c times the thermal resistance between the chip 12c and the heat exchanger 14c. The smaller the thermal resistance is, the closer TC is maintained to TL.

When the above testing is complete, the chip 12c and the heat exchanger 14c are separated back to the "open" position of FIG. 4A. Then each chip that was tested is removed from its socket 12b in the assembly of FIG. 2 and replaced with another chip that needs to be tested. Then, the above cycle is repeated.

Table 1 below contains actual test data which illustrates several important features of the heat exchanger 14c of FIGS. 3, 4A and 4B. One of these features is that the initial thermal resistance between the chip 12c and the heat exchanger 14c in the "closed" position of FIG. 4B is 0.14° C./watt. A second feature is that the force which was used to squeeze the chip 12c and the heat exchanger 14c together to achieve the above thermal resistance was 6.6 pounds.

A third feature is that the maximum force which was used to separate the chip 12c from the heat exchanger 14c, after the above thermal resistance was obtained, was between zero and two ounces. Also, a fourth feature is that after malleable metal 23 had been squeezed against and separated from the chips 12c a total of 5000 times, the thermal resistance only changed from 0.14° C./watt to 0.19° C./watt.

TABLE 1

| | |
|---|---|
| FOIL OF MALLEABLE METAL 23 = | INDIUM |
| RELEASE AGENT 25 = | ALUMINUM NITRIDE |
| INITIAL THERMAL RESISTANCE = | 0.14° C./WATT |
| SQUEEZING FORCE = | 6.6 LBS. |
| SEPARATING FORCE = | LESS THAN 2 OZ. |
| THERMAL RESISTANCE AFTER 5000 CYCLES = | 0.19° C./WATT |
| AREA OF CONTACT SURFACE S1 = | 0.52 SQ. INCHES |

One preferred embodiment of the present invention has now been described in detail in conjunction with FIG. 1 thru FIG. 4B. Now, with reference to FIGS. 5 and 6, several modifications will be described which can be made to the above preferred embodiment.

Figure 5:
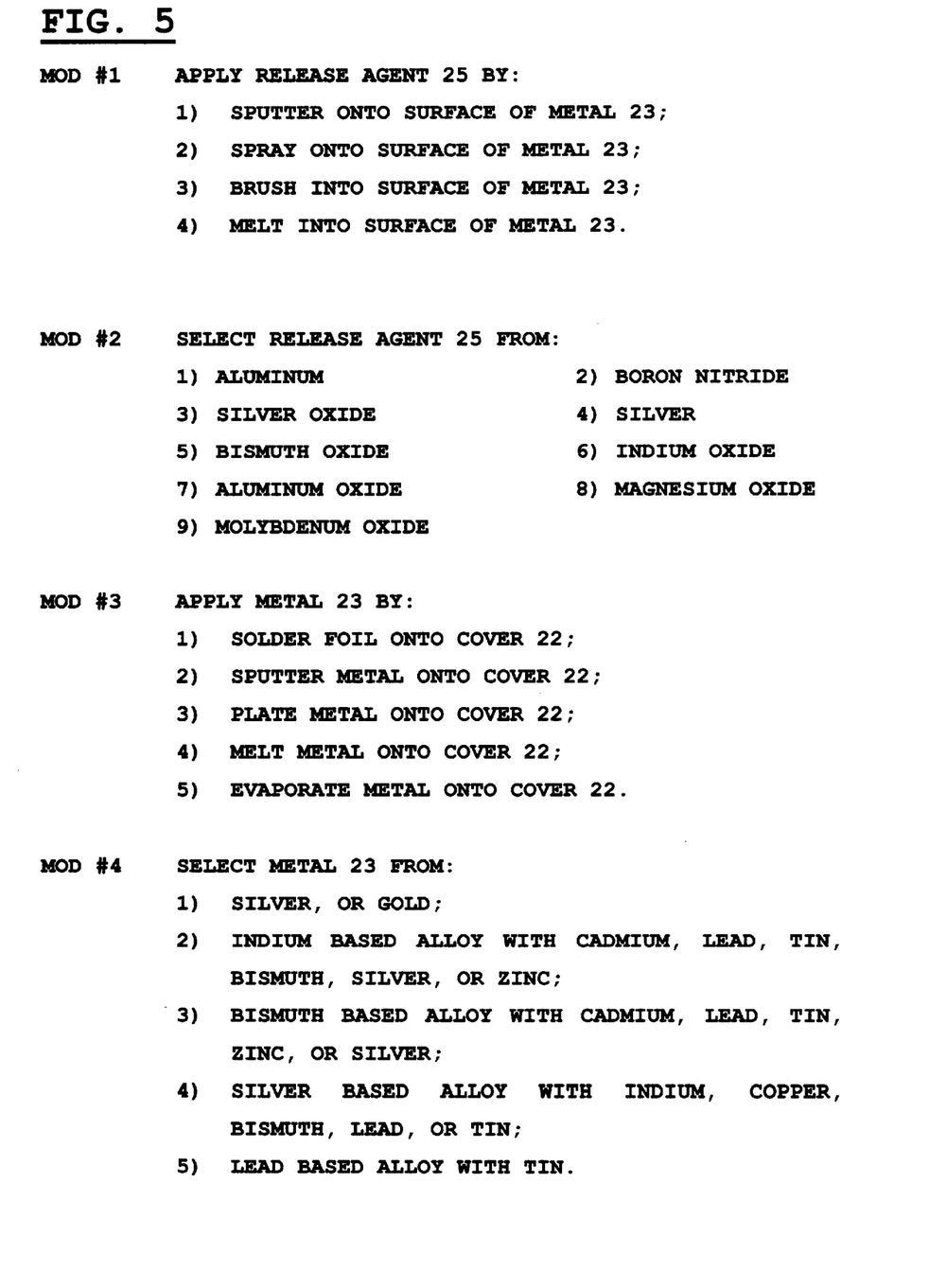
FIG. 5 shows several modifications that can be made to the heat exchanger of FIGS. 3, 4A and 4B.

In the embodiment of FIG. 3, the release agent 25 is embedded into the surface of the metal 23 by the step of rubbing the release agent, in a powder form, into the surface. However, as a modification, the release agent 25 can be sputtered onto the surface of the metal 23, or sprayed onto the surface of the metal 23, or brushed onto the surface of the metal 23, or embedded into the surface of the metal 23 by melting and resolidifying the metal. These modifications are shown in FIG. 5 as "MOD #1".

Also, in the embodiment of FIG. 3, the release agent 25 is aluminum nitride. But, as a modification, the release agent 25 can be aluminum, or boron nitride, or silver oxide, or silver, or bismuth oxide, or indium oxide, or aluminum oxide, or magnesium oxide, or molybdenum oxide. These modifications are shown in FIG. 5 as "MOD #2".

Further, in the embodiment of FIG. 3, the metal 23 is in the form of a foil which is attached by an adhesive to the cover 22. However, as a modification, the foil of the metal 23 can be soldered onto the cover 22; or the metal 23 can be sputtered onto the cover 22; or the metal 23 can be plated onto the cover 22; or the metal 23 can be melted onto the cover 22; or the metal 23 can be evaporated onto the cover 22. These modifications are shown in FIG. 5 as "MOD #3".

Also, in the embodiment of FIG. 3, the metal 23 is indium. But, as one modification, the metal 23 can be silver or gold. As another modification the metal 23 can be an indium based alloy with one or more elements selected from: cadmium, lead, tin, bismuth, or zinc. As another modification, the metal 23 can be a bismuth based alloy with one or more elements selected from: cadmium, lead, tin, zinc, or sliver. As another modification, the metal 23 can be a silver based alloy with one or more elements selected from: indium, copper, bismuth, lead, or tin. As another modification, the metal 23 can be a lead-tin alloy. These particular modifications are shown in FIG. 5 as "MOD #4". However, the metal 23 can be any metal which deforms in the solid state such that it conforms to contact surface S1, when the metal and the contact surface are squeezed together as shown in FIG. 4B, with a force that is so low that it will not damage the integrated circuit module.

Further, in the embodiment of FIG. 2, the heat exchanger 14c presses against the contact surface S1 of an integrated circuit chip 12c. However, as a modification, item 12c can be: a) the combination of an integrated circuit chip which has input/output terminals that are attached to an exterior portion of a substrate; b) the combination of an integrated circuit chip which is completely enclosed in an integrated circuit package; and c) the combination of an integrated circuit chip which has a back that is attached to a lid for an integrated circuit package.

Figure 6:
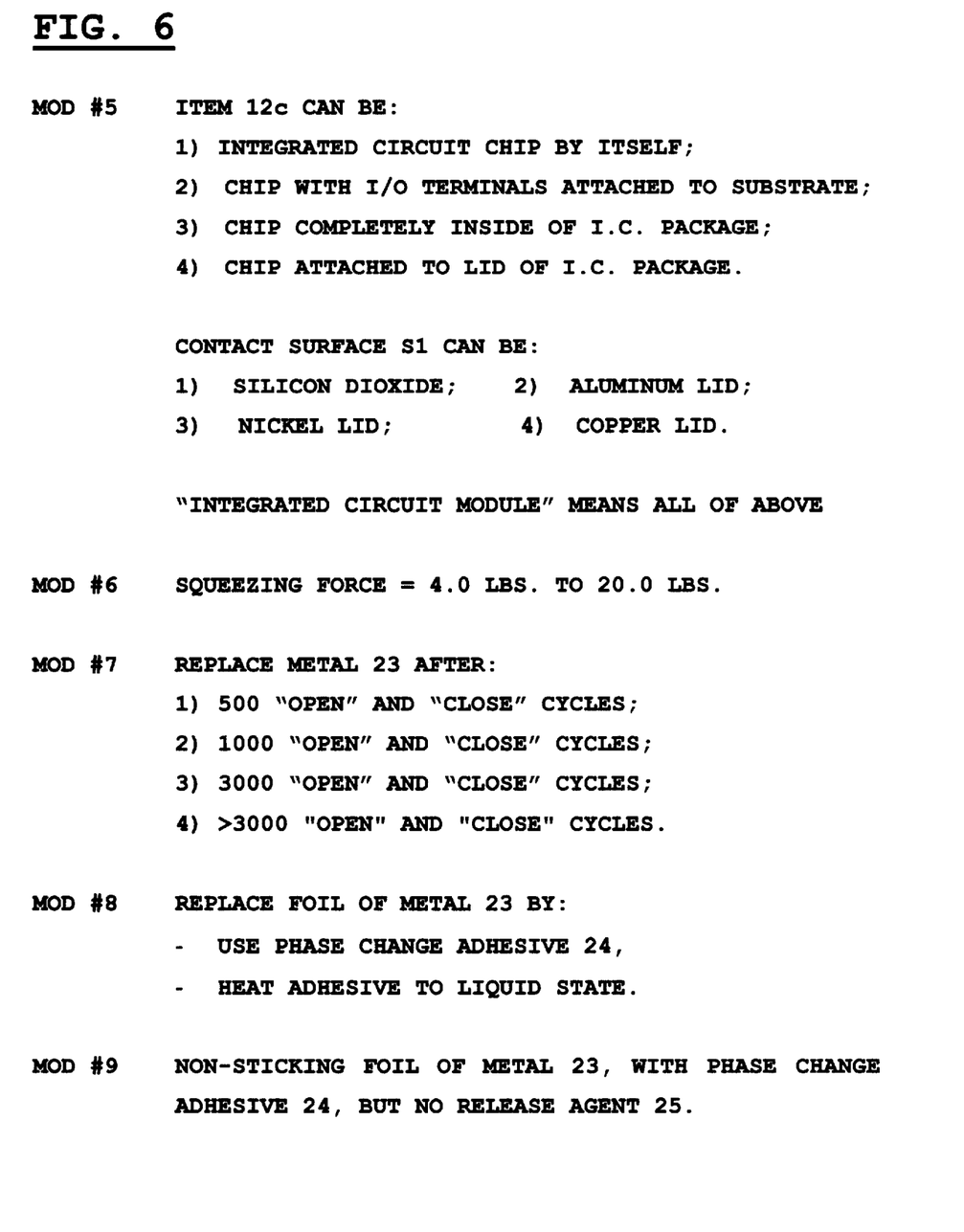
FIG. 6 shows additional modifications that can be made to the heat exchanger of FIGS. 3, 4A and 4B.

In the case where item 12c is an integrated circuit chip by itself, or combination "a" above, the contact surface S1 will usually be a silicon dioxide coating on the chip. In the case where item 12c is combination "b" or combination "c" above, the contact surface S1 will be the 11d of the package which usually is made of aluminum, or nickel, or copper. As used herein, the term "integrated circuit module" includes an integrated circuit chip by itself as well as the above combinations "a", "b", and "c" for item 12c. These modifications are shown in FIG. 6 as "MOD #5".

Also, in the embodiment of TABLE 1, the maximum force with which the heat exchanger 14c and the integrated circuit module 12c where squeezed together was 6.6 pounds. But, as a modification, that force can be adjusted up or down. This adjustment is made, in the FIG. 2 embodiment, by selecting the length of the stops 14d, as was previously described. Preferably, in the "closed" position, the heat exchangers 14c and the integrated circuit modules 12c are squeezed together with a force that ranges from 4.0 pounds to 20.0 pounds. This is shown in FIG. 6 as "MOD #6".

Further, in the embodiment of TABLE 1, the metal 23 was squeezed against and separated from the integrated circuit module 12c a total of 5000 times; and during that cycling, the thermal resistance only changed from 0.14° C./watt to 0.19° C./watt. Therefore, many additional squeezing and separating cycles can be performed before the thermal resistance increase to the point where the metal 23 needs to be replaced. Depending upon the maximum thermal resistance which can be tolerated while the integrated circuit module 12c is tested, the metal 23 can be replaced every five-hundred cycles, or every one-thousand cycles, or every three-thousand cycles, or even less frequently. This is shown in FIG. 6 as "MOD #7".

Also, in the embodiment of FIG. 3, the metal 23 is in the form of a foil that is attached to the cover 22 by an adhesive 24. Preferably, this adhesive 24 is a phase change adhesive which changes from a solid state to a liquid state at a particular temperature T(P); where T(P) is more than the low temperature T(L) at which the heat exchanger 14c is separated from the integrated circuit module 12c, and less than a high temperature T(H) at which integrated circuit module 12c is tested while pressed against the heat exchanger. One example of such an adhesive is solder. Another example of such an adhesive, which changes from a solid to a liquid at 60° C., is called "Powerstrate" from LOCTITE Corporation. By using a phase change adhesive as the adhesive 24 in the embodiment of FIG. 3, the foil of metal 23 is easily replaced simply by removing the heat exchanger 14c from the electromechanical assembly 10 of FIGS. 1A and 1B and heating the adhesive to the liquid state while the foil is pulled off of the heat exchanger. This modification is shown in FIG. 6 as "MOD #8".

Further in the embodiment of FIG. 3, the release agent 25 is incorporated into the foil of the metal 23. However, certain combinations of the malleable metal 23 and the contact surface S1 on the integrated circuit module 12c do not stick together, in a solid state, even if the release agent 25 is eliminated. For example a malleable metal 23 which is an alloy of indium and tin does not stick to a contact surface S1 of aluminum. Such non-sticking combinations of the foil of metal 23 and the contact surface S1, together with the phase change adhesive of MOD #8, comprise another modification which is shown in FIG. 6 as "MOD #9".

Figure 1A:
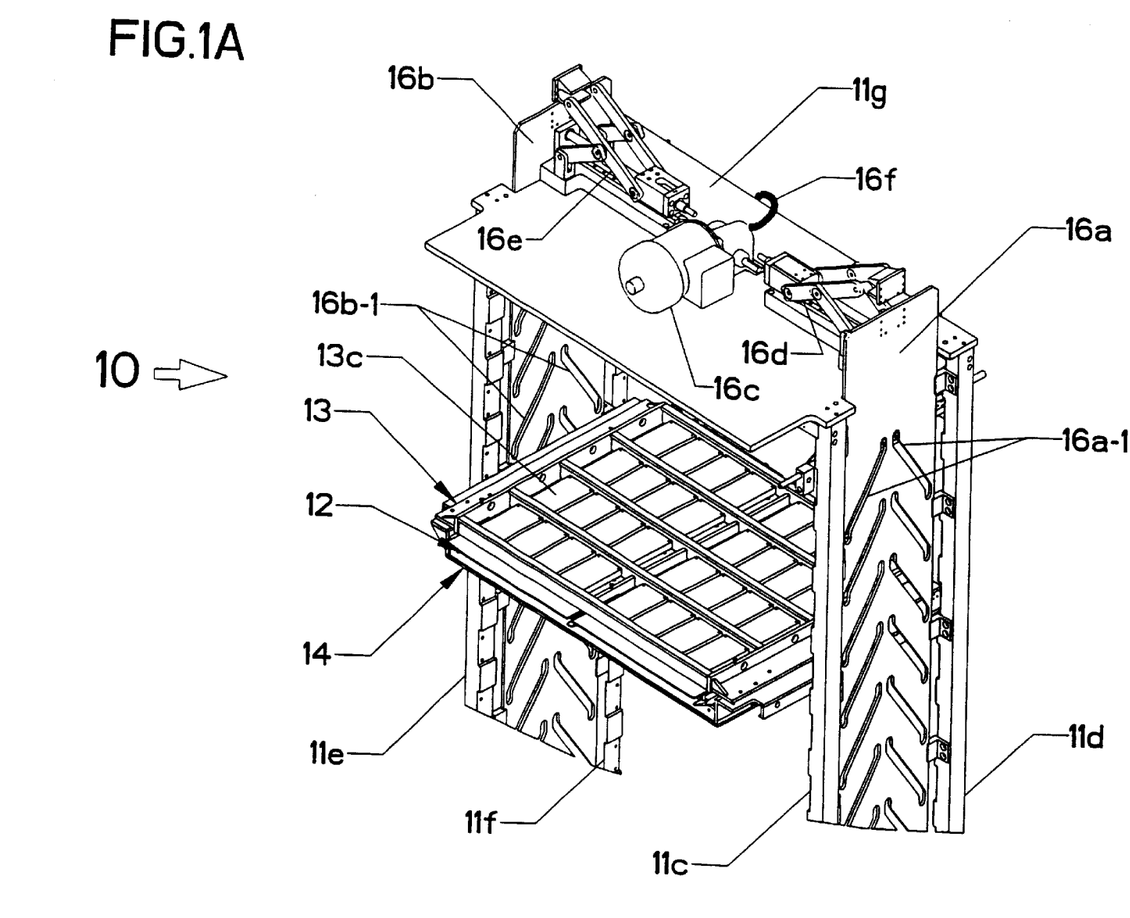
FIG. 1A shows the top half of an electromechanical assembly which is one preferred embodiment of the present invention.
Figure 1B:
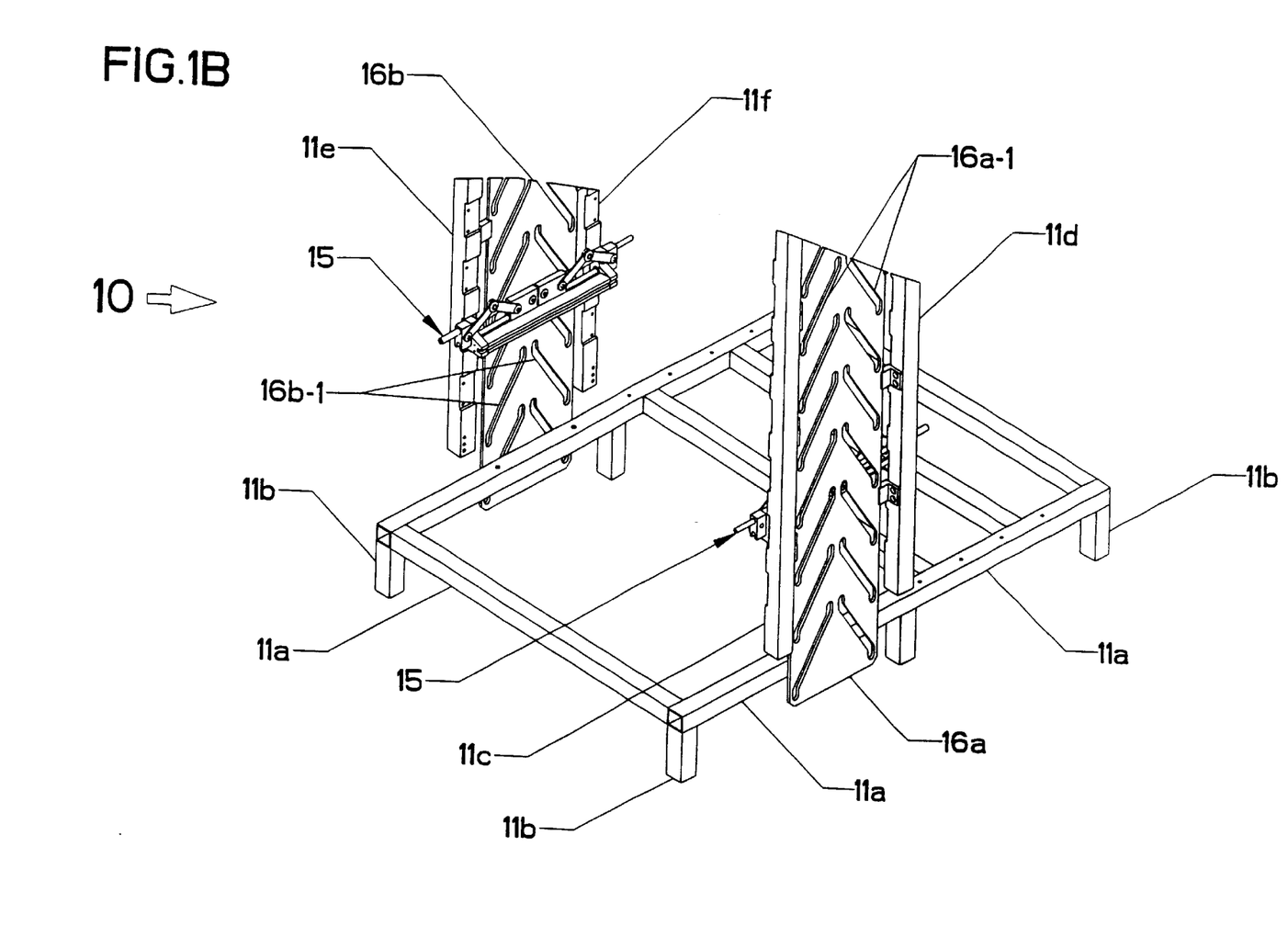
FIG. 1B shows the bottom half of the same electromechanical assembly that is shown in FIG. 1A.
Figure 1C:
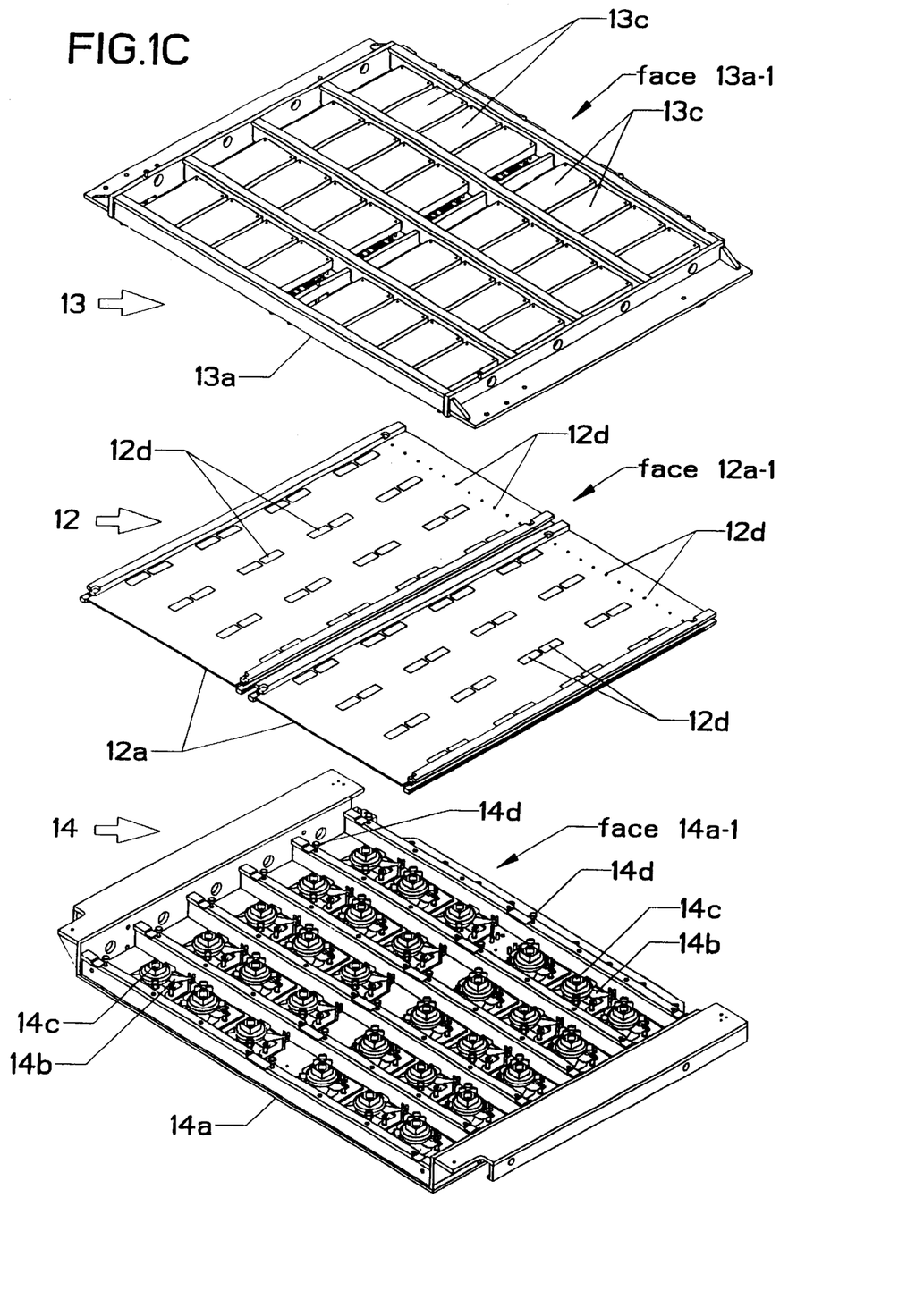
FIG. 1C shows three subassemblies which are included several times in electromechanical assembly of FIGS. 1A and 1B.

Further, in the embodiment of FIGS. 1A–1C, many details are shown regarding the structure of one particular mechanism for squeezing the heat exchanger 14c against an integrated circuit module and separating the heat exchanger from the integrated circuit module. However, as a modification, other mechanisms can be used as desired to perform the squeezing and separating operations.

Similarly, in the embodiment of FIG. 3, the jacket which carries the liquid through the heat exchanger 14c is shown as consisting of one particular base 21 with one particular cover 22. But, as a modification, the jacket portion of the heat exchanger can have any shape and structure as desired.

Accordingly, in view of all of the above described modifications, it is to be understood that the present invention is not limited to just the details of any one embodiment but is defined by the appended claims.

What is claimed is:

1. A method of fabricating a heat exchanger for use in testing multiple integrated circuit modules at a predetermined temperature with each module having an uneven contact surface; said method including the steps of:

providing a hollow jacket which has an input port and an output port for passing a fluid through said jacket; and, constructing a face, on an external portion of said jacket, which consists essentially of a malleable metal that remains in a solid state at said predetermined temperature and has a coating of a release agent that prevents sticking to each contact surface.

2. A method according to claim 1 and further including the step of forming said coating by applying said release agent in a powder form on said malleable metal, and rubbing said powder into said malleable metal.

3. A method according to claim 1 and further including the step of forming said coating by sputtering said release agent onto said malleable metal.

4. A method according to claim 1 and further including the step of forming said coating by spraying said release agent onto said malleable metal.

5. A method according to claim 1 and further including the step of forming said coating by brushing said release agent onto said malleable metal.

6. A method according to claim 1 and further including the step of forming said coating by applying said release agent in a powder form on said malleable metal, and embedding said powder into said malleable metal by melting and resolidifying said malleable metal.

7. A method according to claim 1 and further including the steps of disposing said malleable metal on said hollow jacket in the form of a foil, and attaching said foil to said hollow jacket.

8. A method according to claim 7 wherein said attaching step is performed by placing an adhesive between said foil and said hollow jacket.

9. A method according to claim 7 wherein said attaching step is performed by soldering said foil to said hollow jacket.

10. A method according to claim 1 and further including the step of sputtering said malleable metal onto said hollow jacket.

11. A method according to claim 1 and further including the step of plating said malleable metal onto said hollow jacket.

12. A method according to claim 1 and further including the step of melting said malleable metal onto said hollow jacket.

13. A method according to claim 1 and further including the step of evaporating said malleable metal onto said hollow jacket.

14. A method according to claim 1 and further including the step of selecting said malleable metal from the group of: indium, silver, gold, an indium based alloy with cadmium or lead or tin or bismuth or zinc, a bismuth based alloy with cadmium or lead or tin or zinc or silver, and a silver based alloy with indium or copper or bismuth or lead.

15. A method according to claim 1 and further including the step of selecting said release agent from the group of: aluminum nitride, aluminum, boron nitride, silver oxide, silver, bismuth oxide, indium oxide, aluminum oxide, magnesium oxide and molybdenum oxide.

16. A method of fabricating a heat exchanger for use in testing multiple integrated circuit modules at a predetermined temperature with each module having an uneven contact surface; said method including the steps of:

providing a hollow, jacket which has an input port and an output port for passing a fluids through said jacket;

selecting a foil which consists essentially of a malleable metal, with no release agent, which remains in a solid state at said predetermined temperature and does not stick to said contact surface; and, attaching said foil to an external portion of said hollow jacket with an adhesive.

17. A method according to claim 16 wherein said adhesive changes from a solid state to a liquid state below said predetermined temperature.

\* \* \* \* \*